United States Patent [19]

Willis et al.

[11] 4,415,841

[45] Nov. 15, 1983

[54] TELEVISION RECEIVER FERRORESONANT POWER SUPPLY WITH PERMANENT MAGNET BIASING

[75] Inventors: Donald H. Willis; Randall C. Clayburn, both of Indianapolis, Ind.

[73] Assignee: RCA Corporation, New York, N.Y.

[21] Appl. No.: 268,433

[22] Filed: May 29, 1981

[51] Int. Cl.³ .................. H01J 29/70; H01J 29/76
[52] U.S. Cl. ............................ 315/400; 315/411; 358/190
[58] Field of Search ............... 315/400, 401, 411; 335/217; 336/211, 212; 358/190

[56] References Cited

U.S. PATENT DOCUMENTS

| | | |
|---|---|---|
| 1,706,171 | 3/1929 | Kinnard . |
| 1,910,957 | 3/1933 | Llewellyn . |
| 2,059,393 | 11/1936 | Polydoroff .......................... 171/119 |
| 2,703,391 | 3/1955 | Gunderson .......................... 336/110 |
| 2,730,681 | 1/1956 | Went et al. .......................... 336/110 |
| 3,028,570 | 4/1962 | Taylor .................................. 336/83 |
| 3,148,326 | 9/1964 | Baycura et al. ...................... 323/56 |
| 3,333,221 | 7/1967 | Lockie et al. ........................ 336/179 |
| 3,337,829 | 8/1967 | Schept ................................. 336/178 |
| 3,343,074 | 9/1967 | Brock .................................. 336/211 X |
| 3,454,914 | 7/1969 | Merkl .................................. 336/57 |
| 3,555,350 | 1/1971 | Okuda ................................. 315/400 X |
| 3,590,302 | 6/1971 | Bussey ................................ 335/217 X |
| 3,662,307 | 5/1972 | Tsukuda et al. ..................... 336/178 |
| 3,885,198 | 5/1975 | Pritchard et al. .................... 315/411 |
| 3,947,794 | 3/1976 | Newcomb ........................... 335/217 |
| 3,968,402 | 7/1976 | Sahara et al. ........................ 315/400 X |
| 4,183,079 | 1/1980 | Wachi ................................. 315/411 X |
| 4,254,366 | 3/1981 | Truskalo ............................. 315/400 |
| 4,283,663 | 8/1981 | Miyoshi et al. ..................... 315/400 |
| 4,298,838 | 11/1981 | Akamatsu et al. .................. 336/212 X |
| 4,319,167 | 3/1982 | Wendt ................................. 315/411 |

FOREIGN PATENT DOCUMENTS

906074 7/1972 Canada ................................ 336/212
528423 3/1956 Fed. Rep. of Germany ...... 336/212

Primary Examiner—Theodore M. Blum
Attorney, Agent, or Firm—E. M. Whitacre; P. J. Rasmussen; Joseph Laks

[57] ABSTRACT

A ferroresonant power supply for a television receiver includes a saturable reactor having a magnetizable core and a winding located thereon. Exciting current for the saturable reactor is developed from a source of unregulated input voltage. A magnetic flux is generated in the magnetizable core that links the reactor winding to develop an alternating polarity output voltage. A capacitor develops a circulating current that generates a magnetizing force in a core section associated with the reactor winding. A permanent magnet biases the core to produce a second magnetizing force in the associated core section. The resultant of the two magnetizing forces develops a magnetic flux that substantially saturates the magnetizable material of the associated core section during each cycle of the alternating polarity output voltage to regulate the output voltage. The permanent magnet biasing provides temperature stability of the output voltage in that the tendency of the output voltage to vary with temperature variations in the magnetizable material of the associated core section is substantially offset by the accompanying temperature variations of the biasing strength of the permanent magnet. A high voltage generator of the television receiver is responsive to the regulated alternating polarity output voltage to produce a temperature stable, regulated ultor voltage at a picture tube ultor terminal.

31 Claims, 13 Drawing Figures

TELEVISION RECEIVER FERRORESONANT POWER SUPPLY WITH PERMANENT MAGNET BIASING

This invention relates to ferroresonant power supplies providing regulated, temperature stable output voltages.

A ferroresonant transformer or saturable reactor may be used in a television receiver power supply to provide a regulated ultor voltage and a regulated B+ scanning voltage. When operated at a relatively high input frequency such as the horizontal deflection frequency of around 16 KHz, a ferroresonant power supply is a relatively compact, low weight unit that provides inherent output voltage regulation without the need for relatively complex and expensive electronic regulator control circuitry.

To provide a reasonably good efficiency at the high operating frequency of 16 KHz, the magnetizable core of a ferroresonant saturable reactor may be formed from a high resistivity magnetizable material such as a ferrite. Ferrite materials generally exhibit a high resistance to current, thereby incurring relatively small eddy current losses which otherwise could become excessive. Hysteresis losses in a ferrite core are also relatively low. Even when using a ferrite core, eddy current and hysteresis losses in the core and $I^2R$ losses produced by the circulating current in the capacitor coupled winding of the ferroresonant saturable reactor may produce in the saturating core a substantial temperature rise above ambient.

The saturation flux density, Bsat, of many magnetizable materials decreases with increasing temperature. Since the output voltage of a ferroresonant power supply depends in part on the Bsat value of the saturating core material, a rise in saturating core operating temperature and a consequent reduction in Bsat may result in an undesirable decrease in the power supply output voltage.

To significantly reduce the change in output voltage of a ferroresonant power supply with a change in ambient temperature and with the heating up of the saturating core after the power supply is turned on, the saturating core magnetizable material may be selected as one having a relatively low, negative temperature coefficient of saturation flux density, $-\alpha_f$. The temperature coefficient $\alpha_f$ may be defined as the fractional change in saturation flux density per degree centigrade, or $\alpha_f = \Delta Bsat/Bsat/\Delta T$, where $\Delta Bsat$ is the change in saturation flux density over the temperature range $\Delta T$.

Suitable low temperature coefficient magnetizable materials may be a lithium and a substituted lithium ferrite such as lithium-manganese ferrite or lithium-zinc ferrite having temperature coefficients between $5 \times 10^{-4}$ and $1 \times 10^{-3}$ per degree centigrade over a saturating core operating temperature range of, for example, 0° C. to 120° C. Lithium ferrites and substituted lithium ferrites suitable for use in a ferroresonant power supply are described in the U.S. patent application of I. Gordon, Ser. No. 250,128, filed Apr. 2, 1981, entitled "IMPROVED LITHIUM FERRITE AND METHOD OF MANUFACTURE", herein incorporated by reference.

In a television receiver, the regulated output voltage of a ferroresonant power supply may be used to develop a regulated ultor voltage. For such a use, temperature stability of the ferroresonant power supply regulated output voltage is especially important, as even modest changes in ultor voltage may be undesirable.

A feature of the invention is the design of a ferroresonant power supply that provides a temperature stable, regulated output voltage when a highly stable output voltage is needed, even a voltage more stable than that provided when using a low temperature coefficient saturating core magnetizable material such as lithium ferrite.

A saturable magnetic element includes a magnetizable core and a winding located thereon. An exciting current for the saturable element is developed from a source of input voltage for generating a magnetic flux in the magnetizable core that links the winding to develop an alternating polarity output voltage. A capacitance develops a circulating current that generates a magnetizing force in a core section associated with the winding. A permanent magnet biases the core so as to produce a second magnetizing force in the associated core section. The resultant of the two recited magnetizing forces develops a magnetic flux that substantially magnetically saturates the associated core section magnetizable material for regulating the alternating polarity output voltage. The tendency of the regulated alternating polarity output voltage to vary with temperature variations in the associated core section magnetizable material, due to the temperature variations of the saturation flux density in the associated core section magnetizable material, is substantially offset by the accompanying temperature variations of the biasing strength of the permanent magnet.

In a further embodiment of the invention, the direction of the magnetizing force produced by the permanent magnet in the associated core section magnetizable material is generally transverse or orthogonal to that of the magnetizing force produced by the circulating current.

When used in a television receiver, the ferroresonant power supply may include a high voltage generator that is responsive to the regulated alternating polarity ouptut voltage for developing a temperature stable ultor voltage at a picture tube ultor terminal.

Figure 1:
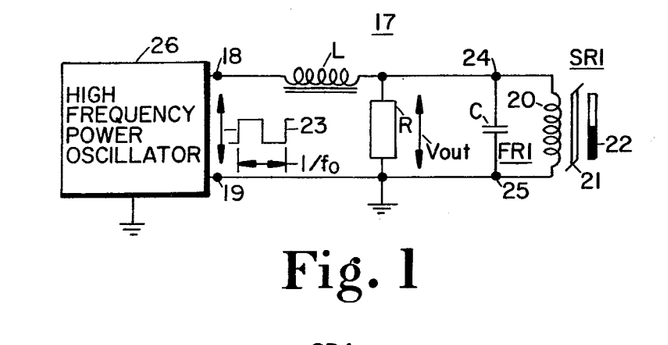
FIG. 1 illustrates a ferroresonant power supply producing a temperature stable, regulated output voltage embodying the invention.

In the ferroresonant power supply 17 embodying the invention and illustrated in FIG. 1, a high frequency power oscillator 26 produces an alternating input square-wave voltage 23 of a frequency $f_0$ across output terminals 18 and 19 of the power oscillator. The frequency of square-wave voltage 23 may be selected within the range of 16 to 25 KHz, for example. The alternating input voltage 23 is applied through an input choke inductor L to a ferroresonant saturable reactor circuit FR1.

Ferroresonant circuit FR1 comprises a saturable magnetic element or saturable reactor SR1 and a resonating capacitor C coupled across a winding 20 of saturable reactor SR1. Saturable reactor SR1 comprises a magnetizable core 21, winding or coil 20 located on core 21, and a permanent magnet 22 located adjacent to core 21.

Inductor L in combination with capacitor C develops an exciting current in reactor winding 20 so as to generate a magnetic flux in core 21 that links the winding to produce an alternating polarity output voltage Vout across the winding terminals 24 and 25. A load circuit, indicated in FIG. 1 generally as a load R, is coupled across terminals 24 and 25 and is energized by the output voltage Vout of ferroresonant power supply 17.

To regulate output voltage Vout by ferroresonant action, capacitor C generates a circulating current during each half cycle of the alternating polarity output voltage that aids in magnetically saturating the core section of magnetizable core 21 that is associated with reactor winding 20. As the core section associated with winding 20 goes into saturation and comes out of saturation, the inductance exhibited by the winding switches between a low impedance value and a high impedance value, respectively. Under control of this switching action, the amplitude of the output voltage, the half cycle area of the output voltage or both the amplitude and half cycle area are regulated against changes in the amplitude of the input voltage 23 and against changes in the loading by load circuit R.

With the saturable reactor in the magnetically unsaturated state, the inductance of winding 20 is relatively large, and the current in reactor winding 20 is relatively small, with only a small exciting or magnetizing current flowing to generate magnetic flux in core 21. The output voltage Vout, being impressed across winding 20, produces a reversal in the direction of the magnetic flux in core 21 and a subsequent buildup of the flux in the opposite direction.

The impressed voltage Vout eventually builds up the magnetic flux in reactor core 21 to a point where the corresponding flux density location of the core magnetizable material is above the knee of the B-H characteristic of the material and into the saturated region of operation. For explanatory purposes, the magnetically saturated region of operation may be considered that region of the B-H characteristic above the knee that exhibits a significantly reduced incremental permeability when compared to the incremental permeability below the knee. For a core magnetizable material such as a lithium ferrite described in the aforementioned U.S. patent application of I. Gordon, the incremental permeability at a point well beyond the knee, at for example, 50 to 100 oersted magnetizing force H, is a relatively low value of 2-10, for example, compared to an incremental permeability of 500-3,000 or more, for example, at points below the knee of the B-H characteristic. Operation of core 21 in the magnetically saturated region of the B-H characteristic results in winding 20 exhibiting a relatively low saturated inductance after the onset of saturation. The circulating current between capacitor C and winding 20 flows after this onset of saturation.

The amplitude of the output voltage Vout and the exact switching instant that winding 20 switches between saturated and unsaturated inductance values, is a function of the saturation flux density Bsat of the magnetizable material of core 21. In general, the amplitude of the output voltage is larger for larger values of Bsat.

Since the value of Bsat is a function of the saturating core material temperature, the regulated output voltage of a ferroresonant power supply tends to change with ambient temperature variations and during power supply warm-up. In accordance with the invention, to overcome this tendency, a permanent magnet 22 of FIG. 1 is located adjacent the saturating core 21 of saturable reactor SR1 for magnetically biasing the core.

The strength of permanent magnet 22 is a function of the magnet temperature, with the magnet strength decreasing, for example, with increasing magnet temperature. With the permanent magnet in proximity to core 21, the magnet temperature follows the variation in core temperature. The biasing of core 21 is such that the tendency of the regulated alternating polarity output voltage Vout to vary with temperature variations of the saturation flux density Bsat produced by temperature variations in saturating core 21 is substantially offset or overcome by the accompanying temperature variations of the biasing strength of permanent magnet 22, thereby producing relatively little change in output voltage with core operating temperature changes.

Figure 12:
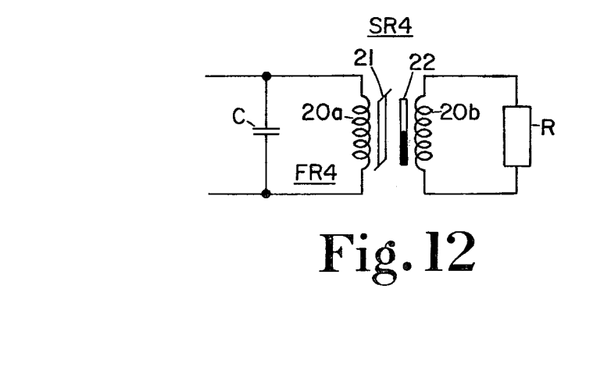
FIG. 12 illustrates a portion of an alternate embodiment of the ferroresonant power supply of FIG. 1.

FIG. 12 illustrates an alternate arrangement, FR4, of the ferroresonant circuit of FIG. 1, wherein the permanent magnet biased saturable reactor comprises a transformer SR4. Transformer SR4 includes a primary winding 20a conductively coupled to resonating capacitor C and located on the saturating core 21 that is being biased by the permanent magnet 22. The regulated alternating polarity output voltage is developed across a secondary winding 20b magnetically coupled to primary winding 20a. The load circuit R is coupled to the transformer secondary winding 20b and is energized by the output voltage developed thereacross.

Figure 3:
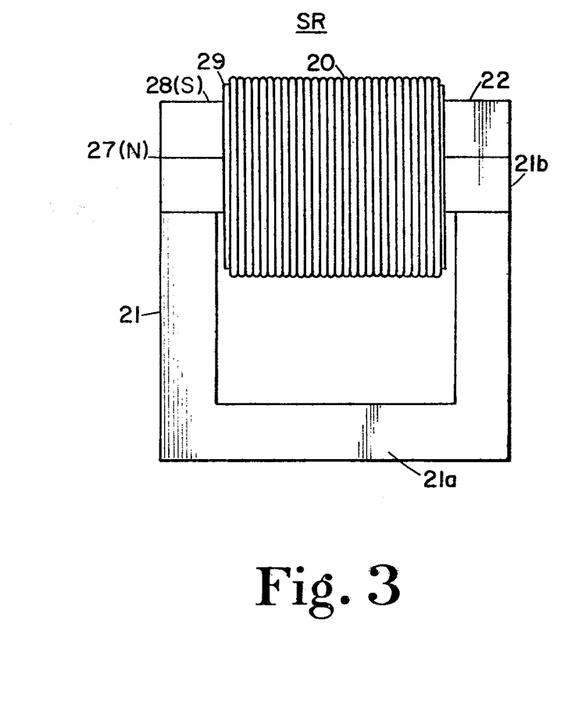
FIG. 3 illustrates a side elevation view of an embodiment of the permanent magnet biased saturable reactor of a ferroresonant power supply embodying the invention.
Figure 4:
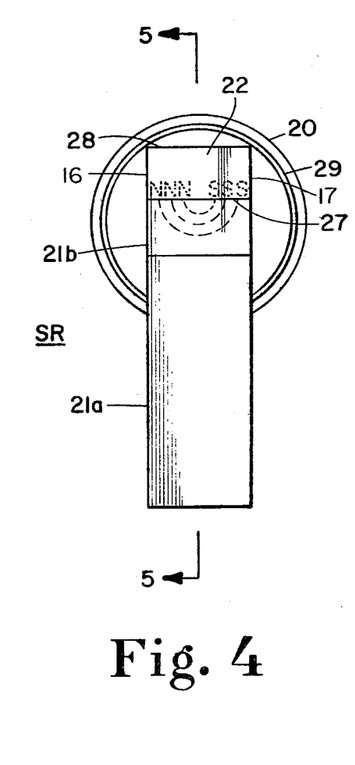
FIG. 4 illustrates an end view of the structure of FIG. 3.
Figure 5:
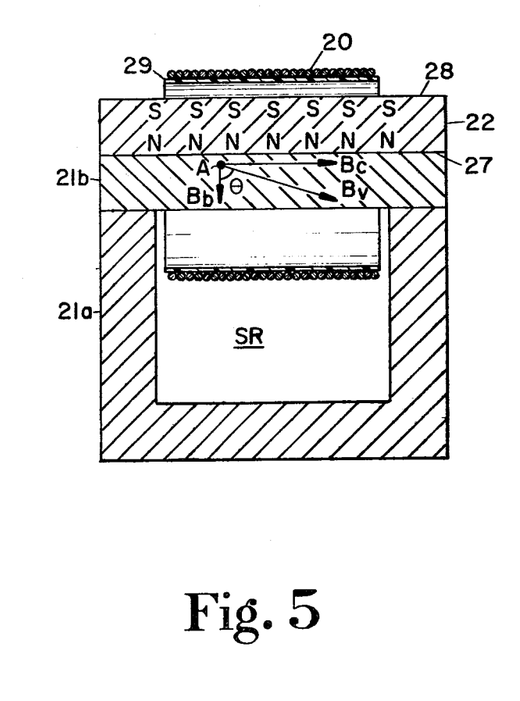
FIG. 5 illustrates a cross-sectional view of the structure of FIG. 4 along the cross-sectional line 5—5 of FIG. 4.

FIGS. 3-5 illustrate plan and cross-sectional views of a construction of a saturable reactor that may be used as the saturable reactor SR1 of FIG. 1. As illustrated in FIGS. 3-5, core 21 comprises a rectangular core formed by a C-core portion 21a adjacent to an I-core portion 21b that forms one leg of the rectangular core. Each of the core portions 21a and 21b may be of rectangular cross-section.

Permanent magnet 22 comprises a rectangularly cross-sectioned rod or bar having a lower face 27 contacting the upper face of I-core portion or section 21b. Saturable reactor winding or coil 20 is wound around a hollow plastic bobbin 29, with the permanent magnet bar 22 and I-core portion 21b of core 21 being located interior to the bobbin. Permanent magnet 22 may be magnetized through the faces 27 and 28 of the permanent magnet bar, with face 27 being illustratively a south pole and with opposite face 28 being a north pole.

With such an arrangement, two magnetizing forces, substantially transverse to each other, are applied to the magnetizable material of I-core section 21b throughout a substantial volume of the I-core section interior to coil 20. The first magnetizing force is a force produced by the magnetizing current in saturable reactor coil 20 and is in a direction generally parallel to the longitudinal axis of the coil. The second magnetizing force is produced by permanent magnet 22 and is generally in a direction transverse or orthogonal to the longitudinal axis of the coil. The resultant force field of the two recited magnetizing forces develops a magnetic flux in core 21 that produces substantial magnetic saturation of the core located within coil 20 during each half-cycle of the alternating polarity output voltage developed across the coil.

As illustrated schematically in the cross-sectional view of FIG. 5, at a point A within the magnetizable material of I-core section 21b, located interior to coil 20, the magnetic flux density vector $\vec{B}_v$ may be broken down into two perpendicular components. A first component is a component $\vec{B}_c$ that links coil 20 and thus is parallel to the longitudinal axis of coil 20, and of a magnitude that depends on the magnetizing force produced by the exciting current in the coil. The second component is a component vector $\vec{B}_b$ perpendicular to the vector $\vec{B}_c$, and produced by the permanent magnet 22. Although the bias flux density vector $\vec{B}_b$ is shown for illustrative purposes as being located in the plane of the drawing figure, the flux density vector $\vec{B}_b$ may also contain a component perpendicular to the plane of the drawing figure, depending upon the exact location of point A within I-core section 21b.

The amplitude of the resultant flux density vector $B_v$ and the angle $\theta$ that the vector makes with the bias flux density vector $\vec{B}_b$ at a particular instant during a cycle of the alternating polarity output voltage Vout developed across coil 20, is a function of the time-varying amplitude of the flux density $\vec{B}_c$ linking coil 20.

Permanent magnet 22 may be formed of a hard magnetizable material such as barium or strontium ferrite, having coercivities on the order of two to four thousand oersted; whereas, I-core section 21b may be formed of a soft ferrite, such as the aforementioned lithium ferrite, that has a coercivity of around one oersted. Because of the large coercivities exhibited by barium or strontium ferrite, permanent magnet 22 undergoes relatively little demagnetization when it becomes part of the magnetic circuit formed in conjunction with core 21. Also, relatively little demagnetization of permanent magnet 22 occurs upon application of a demagnetizing force field generated by the current in saturable reactor coil 20. Peak magnetizing forces generated by coil 20 typically may not exceed several hundred oersted, values insufficient to significantly demagnetize a barium or strontium ferrite magnet exhibiting coercivities of several thousand oersted. Thus, the bias field produced by permanent magnet 22 in the magnetizable material of I-core section 21b interior to coil 20 remains relatively constant at least prior to the onset of saturation of the soft ferrite.

Figure 9:
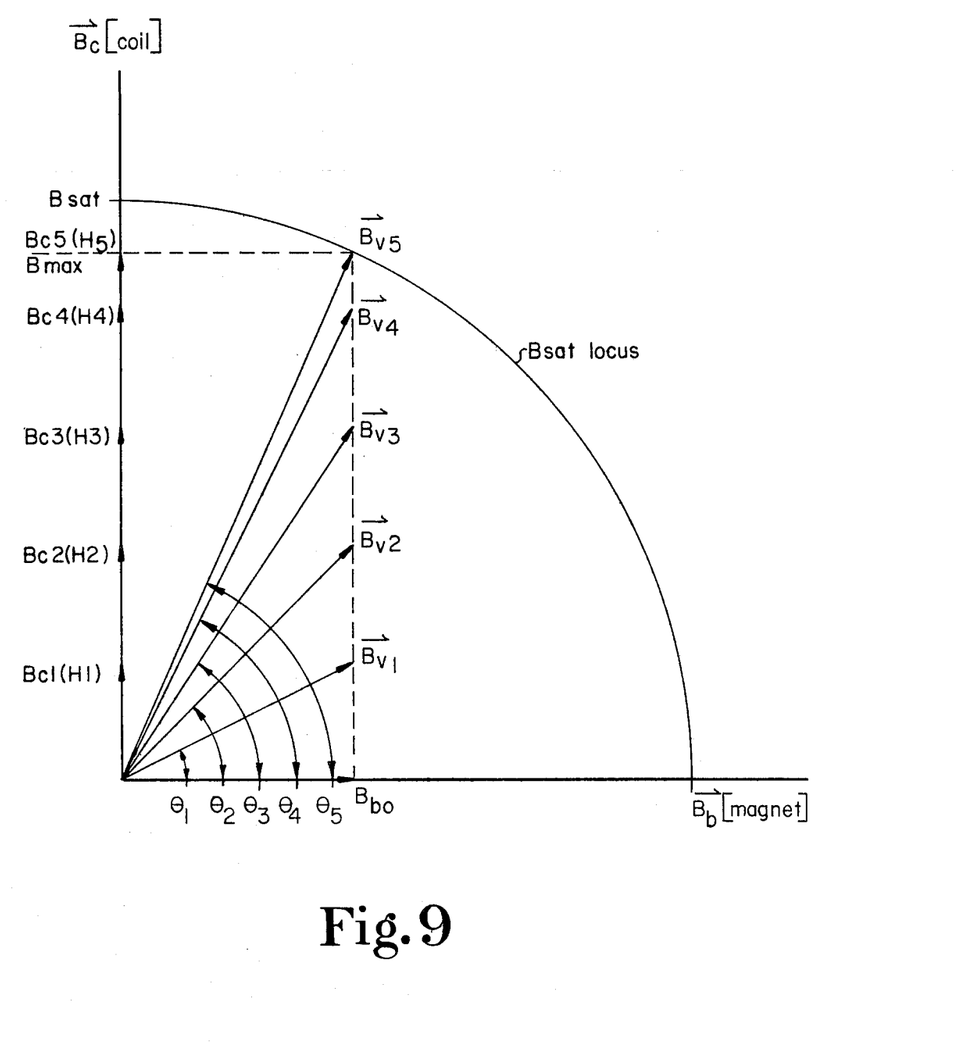
FIGS. 9-11 illustrate vector diagrams and curves useful in explaining the operation of the circuits of FIGS. 1, 2, 12 and 13.

FIG. 9 illustrates the relationship among the various aforementioned flux density vectors at a given point within the magnetizable material of I-core section 21b interior to coil 20 at various selected instants within a cycle of the output voltage. The flux density vector $\vec{B}_c$ produced at different values of magnetizing force generated by magnetizing current flowing in saturable reactor coil 20 is illustrated along the Y axis. The flux density vector $\vec{B}_{b0}$ produced by permanent magnet 22 is illustrated along the X axis, at right angles to the coil vector $\vec{B}_c$.

During the unsaturated intervals of the alternating polarity output voltage Vout, when coil 20 exhibits a relatively large, unsaturated inductance, the vector component of the flux density in the core material interior to the coil normal to the conductor turns of the coil, that is, the flux density vector $\vec{B}_c$ linking coil 20, eventually begins to increase with increasing magnetizing force H being produced by the magnetizing current in coil 20. As the magnetizing force produced by coil 20 increases from a force $H_1$ to a force $H_4$, the flux density normal to the conductor turns of coil 20 increases from a flux density magnitude $B_{c1}$ to a flux density magnitude $B_{c4}$.

As mentioned previously, relatively little demagnetization of permanent magnet 22, formed from a hard ferrite such as barium or strontium ferrite, occurs when coil 20 produces relatively low strength magnetizing force fields. Thus, during the afore-discussed interval of increasing flux density normal to coil 20, the flux density in the core material interior to the coil in a direction parallel to the bias magnetic field produced permanent magnet 22 remains, for present explanatory purposes, relatively unchanged, at an illustrative magnitude $B_{b0}$.

The resultant flux density vector $\vec{B}_v$ produced in the magnetizable material of I-core section 21b by the combination of magnetizing forces generated by the permanent magnet 22 and by the magnetizing current flowing in coil 20 is a vector which increases in amplitude as the coil magnetizing force increases in amplitude and which rotates in direction so as to produce an increasing angle $\theta$ between the resultant flux density vector $\vec{B}_v$ and the bias flux density vector $\vec{B}_b$.

When the coil magnetizing force has increased sufficiently in amplitude to produce a resultant vector $\vec{B}_{v5}$ having an amplitude near that of saturation flux density Bsat, the inductance of saturable reactor coil 20 switches to a relatively low saturated inductance, beginning the circulating current interval within the output voltage cycle. The amplitude of the flux density in I-core section 21b normal to the conductor turns of coil 20 at the onset of saturation is $B_{c5}=B_{max}$.

The quantity Bmax is smaller than the saturation flux density Bsat. The output voltage Vout therefore tends to be smaller in amplitude when using a permanent magnet biased saturable reactor. Such tendency may be compensated by increasing the number of turns in coil 20, by increasing the cross-sectional area of the saturating core interior to the coil or by other suitable techniques. Since the amplitude of the regulated output voltage Vout when using a permanent magnet biased saturable reactor is generally proportional to the maximum flux density normal to the conductor turns of coil 20 prior to the onset of saturation, that is, proportional to Bmax, temperature stability of the regulated output voltage may be achieved by the matching or the proper selection of permanent magnet material and saturating core material with respect to their temperature characteristics in order to produce a value of Bmax that is constant as the temperature changes.

Figure 10:
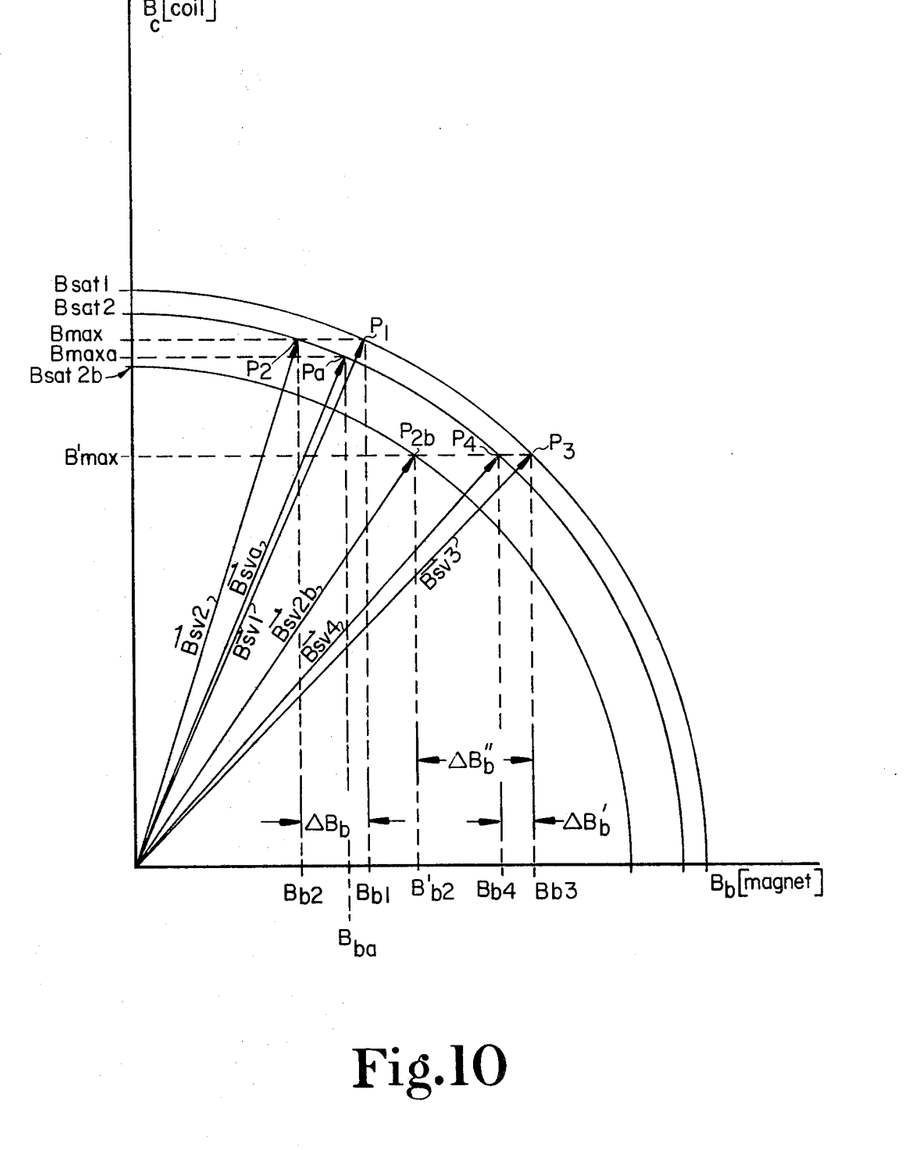

In FIG. 10, assume that, at a given saturating core and permanent magnet operating temperature $T_1$, the permanent magnet bias strength is $B_{b1}$ and the saturation flux density value of the saturating core material is $B_{sat1}$. When the onset of saturation is achieved during each cycle of the alternating polarity output voltage Vout, the vector arrow tip of the resultant flux density vector, $\vec{B}_{sv1}$, in the saturating core material interior to coil 20 is located at point $P_1$. The maximum flux density normal to the conductor turns of coil 20 that is attainable prior to onset of saturation is Bmax.

To provide temperature stability of the regulated output voltage, the flux density component Bmax should be relatively unchanged when the saturating core and permanent magnet are operated at a different temperature $T_2$, illustratively greater than the temperature $T_1$. At the greater temperature $T_2$, the value of saturation flux density of the saturating core material is a value $B_{sat2}$, which is smaller than the value $B_{sat1}$ at temperature $T_1$ by an amount $\Delta Bsat = \alpha_f \Delta T B_{sat1}$, where $\Delta T = T_2 - T_1$.

To attain the same maximum flux density, Bmax, normal to the conductor turns of the coil 20 at the higher temperature $T_2$, the resultant flux density vector at saturation at the temperature $T_2$ must equal the vector $\vec{B}_{sv2}$, having its vector arrow tip at the point $P_2$ of FIG. 10. To enable the resultant vector $\vec{B}_{sv2}$ to have its vector tip at point $P_2$, the bias strength of the permanent magnet 22 must decrease to a new smaller value $B_{b2}$. Thus, for a given saturating core material having a temperature coefficient of saturation flux density of $\alpha_f$, a permanent magnet material must be selected such that the negative temperature coefficient $-\alpha_m$ of the permanent magnet material produces the appropriate decrease in bias strength of $\Delta B_b = B_{b1} - B_{b2}$, where $\alpha_m$ is the fractional change in permanent magnet bias strength per degree centigrade or $\alpha_m = \Delta B_b / B_b / \Delta T$.

If the temperature coefficient $\alpha_m$ of the permanent magnet material is not matched with the temperature coefficient $\alpha_f$ of the saturating core material, then the maximum normal flux density attained at the onset of saturation may differ at the two core operating temperatures, $T_1$ and $T_2$, thereby resulting in relatively poor temperature stability of the regulated output voltage. For example, assume that the temperature coefficient $\alpha_m$ of the magnet material is smaller than needed to provide exact temperature compensation of the output voltage at the two temperatures $T_1$ and $T_2$. Then, at temperature $T_2$ the bias strength of the magnet would be at a value $B_{ba}$ intermediate the values $B_{b1}$ and $B_{b2}$. The resultant flux density vector at the onset of saturation at the greater temperature $T_2$ is the vector $\vec{B}_{sva}$ with its vector arrow tip at point $P_a$ of FIG. 10. The component of the vector $\vec{B}_{sva}$ that is normal to the conductor turns of coil 20 has an amplitude $B_{maxa}$ that is smaller than the amplitude Bmax attained at the lower temperature $T_1$. Thus, temperature stability of the output voltage is not achieved when the magnet bias strength is not properly selected relative to $\alpha_m$, $\alpha_f$, and $B_{sat1}$.

Various trade-offs exist when selecting the values of the parameters such as Bsat, Bmax, $B_b$, $\alpha_m$ and $\alpha_f$ during the design of a permanent magnet biased saturable reactor ferroresonant system that provides a temperature stabilized regulated output voltage. For example, in general, the temperature coefficient of the permanent magnet $\alpha_m$ must be selected to be greater in magnitude than the temperature coefficient $\alpha_f$ of the saturating core material to provide improved temperature stability of the output voltage. The percentage difference in temperature coefficients between the two materials may be reduced if one elects to use a greater strength bias magnet.

Consider in FIG. 10, a permanent magnet having a bias strength at temperature $T_1$ of a value $B_{b3}$ greater than the aforementioned bias strength $B_{b1}$. The resultant flux density vector for a temperature $T_1$ is the vector $\vec{B}_{sv3}$ having its vector arrow tip located at point $P_3$. The maximum flux density $B_{max}'$ normal to the conductor turns of coil 20 attained for a temperature $T_1$ is the projection of the vector $\vec{B}_{sv3}$ on the Y axis of FIG. 10. To provide the same maximum flux density $B_{max}'$ at the higher temperature $T_2$ where the saturation flux density of the saturating core material has decreased to a value $B_{sat2}$, the resultant flux density vector at the onset of saturation must equal the vector $\vec{B}_{sv4}$ having its vector arrow tip at point $P_4$.

The projection of $\vec{B}_{sv4}$ on the X axis indicates the new, decreased value of permanent magnet bias strength required at the higher temperature $T_2$ to maintain the regulated output voltage substantially unchanged at the new temperature. The projection of $\vec{B}_{sv4}$ on the X axis indicates a decreased bias strength of $B_{b4}$ at temperature $T_2$ is required, if temperature stability is to be achieved.

When a permanent magnet with increased strength of $B_{b3}$ at temperature $T_1$ is used, the temperature coefficient of the permanent magnet must be selected to have a value $\alpha_m'$ so as to produce a change in bias strength 66 $\Delta B_b' = B_{b3} - B_{b4}$ over the temperature range $\Delta T = T_2 - T_1$. By inspection of FIG. 10, one notes that the $\Delta B_b'$ needed when using a greater strength magnet is substantially less than the $\Delta B_b$ previously needed when using the lesser strength permanent magnet. From this fact, one may conclude that the temperature coefficient $\alpha_m'$ required for the stronger permanent magnet is smaller in magnitude than the temperature coefficient $\alpha_m$ required for the weaker magnet. Thus, the biasing strength of the permanent magnet may to a certain extent be adjusted to provide the required output voltage temperature stability if only a limited number of permanent magnet and saturating core materials are available to choose from.

One should note, however, that a trade-off for using a permanent magnet with a relatively small temperature coefficient of magnet strength $\alpha_m$ may be the need for using an arrangement that requires a relatively large magnet bias strength. Such an arrangement produces a relatively low maximum flux density Bmax normal to the conductor turns of coil 20. To maintain a relatively high output voltage Vout at the relatively low values of Bmax developed, the number of conductor turns and/or cross-sectional area of the saturating core interior to the coil may have to be increased. Furthermore, a relatively low ratio of Bmax to Bsat may result in relatively poor output voltage regulation with input voltage and loading changes, as will be discussed later.

As mentioned previously, to provide temperature stability of the regulated output voltage, the temperature coefficients of the permanent magnet and saturating core materials should be carefully matched, with the temperature coefficient of the permanent magnet material generally being greater than that of the saturating core material by an amount that depends upon such factors as the desired values of Bmax and of biasing strength $B_b$ of the permanent magnet. Assume, for example, that the saturating core material is selected as one having a relatively large coefficient $\alpha_f$ of saturation flux density such that, at the higher temperature $T_2$, the saturation flux density decreases from a value $B_{sat1}$ at temperature $T_1$ to a lower value $B_{sat2}$. To produce a relatively unchanged maximum flux density at the onset of saturation of value $B_{max}'$ at both the temperature $T_1$ and the temperature $T_2$, the resultant flux density vector at saturation must change and angle it makes with the X-axis in order to accommodate for the decrease in vector amplitude due to the decrease in saturation flux density. The resultant flux density vector changes from the vector $\vec{B}_{sv3}$ to the vector $\vec{B}_{sv2d}$ having its vector arrow tip at the point $P_{2b}$.

The change in permanent magnet bias strength of $\Delta B_b'' = B_{b3} - B_{b2}'$ required when using a higher temperature coefficient saturating core material is greater than the change in permanent magnet bias strength $\Delta B_b'$ required when using a smaller temperature coefficient saturating core material, indicating that a larger temperature coefficient $\alpha_m''$ permanent magnet material is required when used in conjunction with a larger temperature coefficient $\alpha_f$ saturating core material.

If the saturating core material for I-core section 21b is selected as a lithium ferrite or a substituted lithium ferrite, then a ceramic magnet material such as a barium or strontium ferrite may be selected as the permanent magnet material in order to provide good temperature coefficient matching between the soft and hard ferrite materials. Lithium ferrite and substitute lithium ferrite, such as lithium manganese-zinc ferrites, have temperature coefficients of saturation flux density $\alpha_f$ between about one-half and one parts per thousand per degree centigrade. Barium and strontium ferrites have temperature coefficients of magnet strength between about 1.8 to 2.0 parts per thousand per degree centigrade, a range of values which will result in providing relatively good temperature stability to the regulated output voltage Vout, provided the correct magnet bias strength is chosen.

In contrast, if a manganese-zinc ferrite were used as the saturating core material, a relatively high temperature coefficient permanent magnet material would have been required, since manganese-zinc ferrite has a temperature coefficient of around three to three and one-half parts per thousand. If the temperature coefficient of the permanent magnet is chosen as about two to four times the temperature coefficient of the soft ferrite to produce Bmax values approaching Bsat values, then the temperature coefficient of the permanent magnet would have to be around 12 to 15 parts per thousand per degree centigrade. Permanent magnet material having such a relatively high temperature coefficient may not be available, or if available, may be unsuitable for use in conjunction with a cost-effective ferroresonant power supply.

Figure 2:
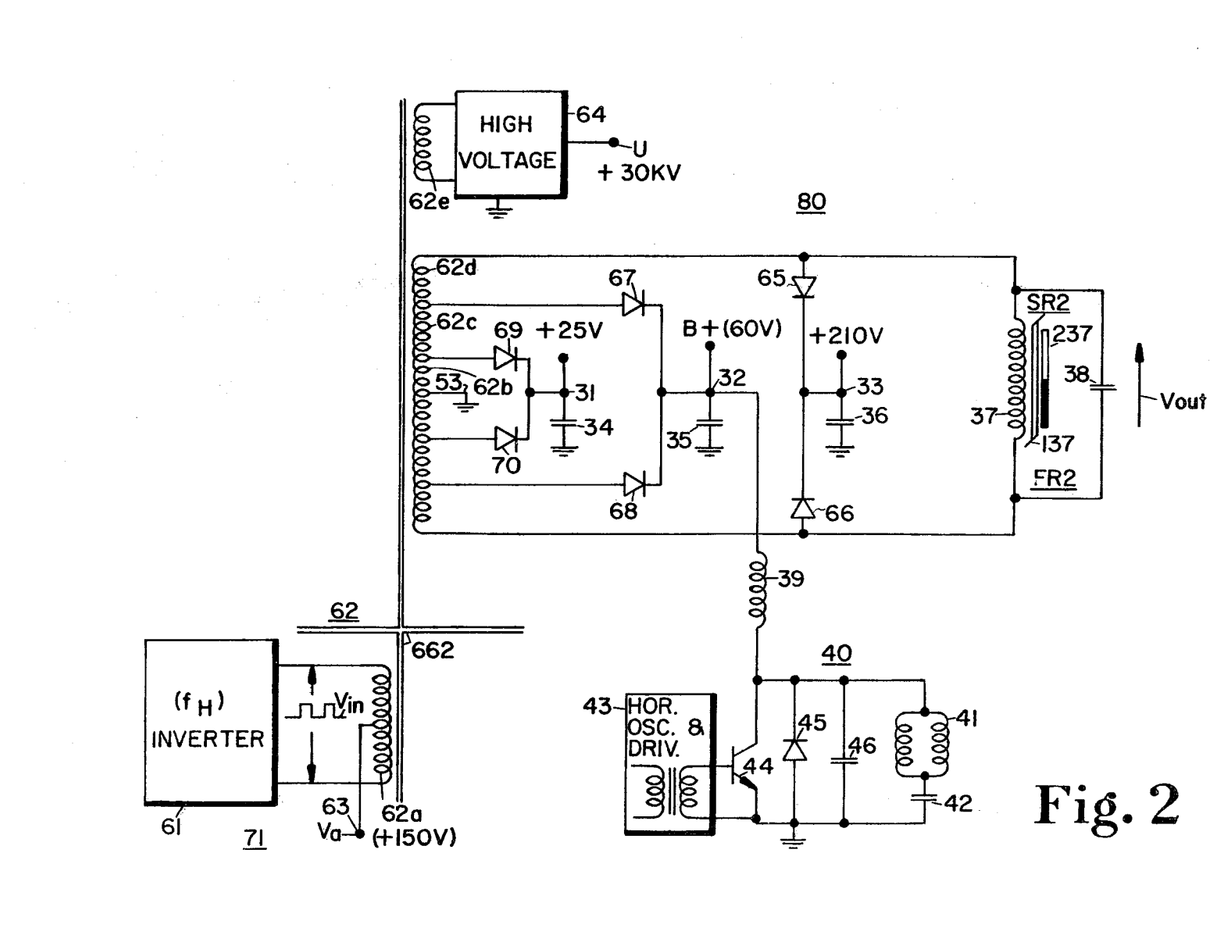
FIG. 2 illustrates a television receiver ferroresonant power supply embodying the invention.

FIG. 2 illustrates a temperature stable ferroresonant power supply 80 embodying the invention that provides regulated DC output voltages for a television receiver including a regulated ultor output voltage. Temperature stability of the regulated output voltage is especially important when the output voltage is the ultor voltage of a television receiver, in that, for example, excessive ultor voltages may be generated at turn-on of the television receiver or in a cold ambient temperature environment. The excessive ultor voltages may result in the generation of an excessive, undesirable amount of X-radiation.

The television receiver ferroresonant power supply 80 illustrated in FIG. 2 in general operates in a manner similar to that described in the U.S. patent application of D. H. Willis, Ser. No. 220,847, filed Dec. 29, 1980, entitled "TELEVISION RECEIVER FERRORESONANT LOAD POWER SUPPLY", herein incorporated by reference. To provide temperature stability of the regulated output voltages, the inventive aspects of the permanent magnet biasing arrangement, previously described, are used in the ferroresonant arrangement FR2 of FIG. 2.

In FIG. 2, a primary winding 62a of a high leakage inductance transformer 62 is coupled to a source 71 of unregulated alternating input voltage Vin. Source 71 comprises an inverter 61 and a DC input terminal 63 coupled to a center tap of primary winding 62a. An unregulated DC voltage $V_a$ is applied to terminal 63. Inverter 61 is operated at a high frequency of, for example, the 15.75 KHz horizontal deflection frequency, $f_H$.

When the voltage Vin is applied to primary winding 62a, horizontal rate alternating polarity output voltages are developed across secondary output windings 62b–62d and a high voltage secondary output winding 62e. A common center tap lead 53 of windings 62b–62d is coupled to ground.

The alternating polarity output voltage developed across winding 62b is full-wave rectified by diodes 69 and 70 and filtered by a capacitor 34 to develop a DC supply voltage at a terminal 31, of illustratively +25 volts, to energize such television receiver circuits as the vertical deflection circuit and the audio circuit. The alternating polarity output voltage developed across winding 62d is full-wave rectified by diodes 65 and 66 and filtered by a capacitor 36 to develop a DC supply voltage, of illustratively +210 volts, at a terminal 33 to power such circuits as the television receiver picture tube driver circuits.

The alternating polarity output voltage developed across winding 62c is full-wave rectified by diodes 67 and 68 and filtered by a capacitor 35 to develop at a terminal 32 a B+ scan supply voltage for a horizontal deflection winding 41. To generate horizontal scanning or deflection current in horizontal deflection winding 41, a horizontal deflection generator 40 is coupled to terminal 32 through an input choke 39. Horizontal deflection generator 40 is energized by the B+ scan supply voltage and comprises a horizontal oscillator and driver 43, a horizontal output transistor 44, a damper diode 45, a horizontal retrace capacitor 46 and an S-shaping or trace capacitor 42 coupled in series with horizontal deflection winding 41 across horizontal output transistor 44.

The alternating polarity output voltage developed across high voltage output winding 62e is coupled to a high voltage circuit 64 to develop a DC ultor high voltage or accelerating potential at a terminal U for the television receiver picture tube, not illustrated. High voltage circuit 64 may comprise a conventional voltage multiplier circuit of the Cockroft-Walton type, or may comprise a half-wave rectifier arrangement with a plurality of diodes integrally molded as a single unit with a plurality of winding sections of the high voltage winding 62e, not individually illustrated.

Secondary output windings 62b–62d and high voltage secondary output winding 62e are magnetically closely or tightly coupled one to another. To regulate the secondary output winding voltages against variations in the amplitude of the input voltage Vin and against loading changes by the load circuits coupled to terminals 31–33 and beam current loading changes on ultor terminal U, and to provide temperature stability of those output voltages, a ferroresonant saturable reactor circuit FR2 embodying the invention is coupled as a load circuit across one of the tightly or closely coupled secondary output windings of transformer 62. In FIG. 2, the ferroresonant load circuit FR2 is illustratively coupled across secondary output winding 62d.

Ferroresonant load circuit FR2 comprises a coil or winding 37 wound around at least a portion of a saturating, magnetizable core 137 of a saturable reactor SR2, a permanent magnet 237 biasing the core and a resonating capacitor 38 coupled across coil 37.

The output voltage Vout across the saturating coil 37 is regulated by the ferroresonant action of load circuit FR2. By coupling coil 37 across the secondary output winding 62d of transformer 62, the ferroresonant load circuit FR2 acts as a regulating load circuit coupled to winding 62d to maintain the voltage across winding 62d as the regulated voltage Vout. With the voltage across secondary winding 62d regulated by the ferroresonant load circuit FR2, the output voltages across all the other secondary windings, tightly coupled with winding 62d, are also regulated. Thus, the output voltages across windings 62b and 62c and high voltage output winding 62e are regulated by the regulating action on the voltage Vout of ferroresonant load circuit FR2. Because of the loose magnetic coupling between primary windings 62a and the secondary windings 62b–62e, the voltages across these secondary windings can remain relatively unchanged in amplitude or half-cycle area even though the voltage across the primary winding varies in amplitude.

Permanent magnet 237 biases saturating core 137 in such a manner as to provide temperature stability of the regulated output voltage Vout and of the other output voltages developed across the secondary windings of transformer 62 and of the DC and ultor voltages. The construction of the saturable reactor SR2 of the ferroresonant load circuit FR2 of FIG. 2 may be similar to that of the saturable reactor SR of FIGS. 3–5, aforedescribed, or may be similar to the saturable reactor SRA illustrated in FIGS. 6–8.

Figure 6:
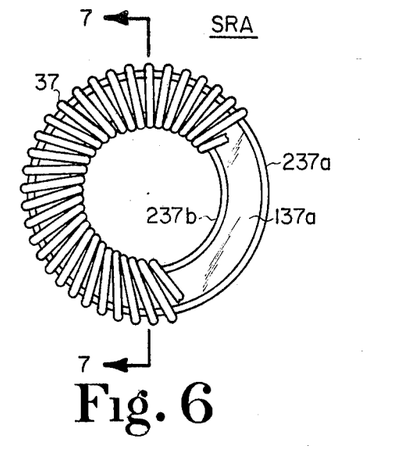
FIG. 6 illustrates a side elevation view, partially broken away, of another embodiment of the permanent magnet biased saturable reactor of a ferroresonant power supply embodying the invention.
Figure 7:
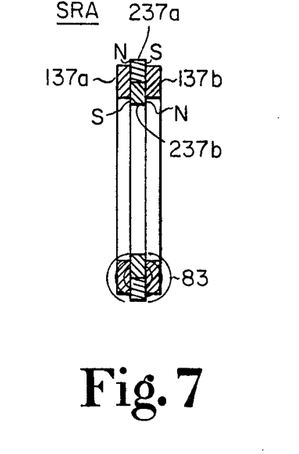
FIG. 7 illustrates a cross-sectional view of the structure of FIG. 6 along the cross-sectional line 7—7 of FIG. 6.
Figure 8:
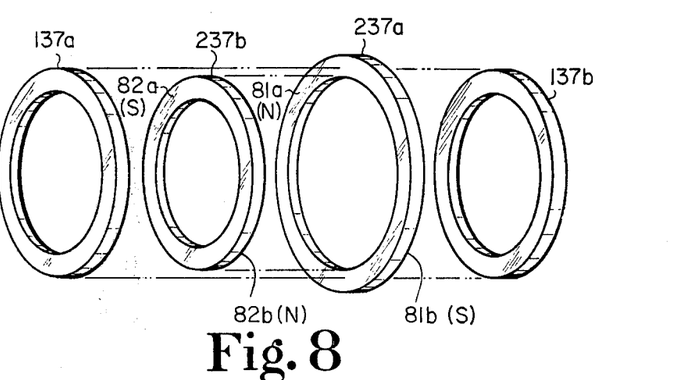
FIG. 8 illustrates an exploded perspective view of the combined core and permanent magnet of the structure of FIG. 6.

Saturable reactor SRA of FIGS. 6–8 is constructed in a toroidal configuration. FIG. 7 illustrates an end cross-sectional view, along the lines 7—7 of FIG. 6, of the core and permanent magnet portion of saturable reactor SRA, with coil 37 of the saturable reactor being omitted from FIG. 7. FIG. 8 illustrates an exploded perspective view of the core and permanent magnet portion of the structure of FIG. 6.

The core of saturable reactor SRA comprises two rings, or washers, 137a and 137b, of a soft ferrite material such as lithium ferrite. Interposed between the two soft ferrite ring members are two concentrically assembled permanent magnet rings 237a and 237b formed illustratively of a hard ferrite material such as barium or strontium ferrite. Each of the permanent magnet ring members is magnetized through its face, with the face of one of the permanent magnet rings being magnetized in the opposite polarity to that of the adjacent face of the other permanent magnet ring. Thus, as illustrated in FIGS. 7 and 8, face 81a of permanent magnet ring 237a is magnetized as a north pole, for example, and the opposite face 81b of the same ring is magnetized as a south pole; whereas face 82a of the other permanent magnet ring 237b is magnetized as a south pole and the opposite face 82b is magnetized as a north pole. A single ring having two concentrically magnetized sections may be substituted for permanent magnet rings 237a and 237b.

Using such a ring construction for saturable reactor SRA, the flux density field that is produced by the permanent magnet rings 237a and 237b in the saturating core rings 137a and 137b is substantially orthogonal to the flux density field produced by the magnetizing current flowing in coil 37, throughout substantially the entire volume of the saturating core rings 137a and 137b. Because of the toroidal winding configuration of coil 37, the biasing field 83 produced by permanent magnet rings 237a and 237b, only partially illustrated in FIG. 7, is generally perpendicular to the flux density field produced by the current in the coil throughout substantially the entire volume of the saturating core rings 137a and 137b. Furthermore, the biasing field is concentrated mainly in the soft ferrite core rings rather than in air.

An advantage of using the ring geometry of saturable reactor SRA of FIGS. 6–8 is the capability of that geometry to concentrate the field lines produced by the permanent magnet rings within the soft ferrite core rings, thereby providing a relatively large bias flux density field in the soft ferrite core for a given permanent magnet pole strength. Also, the total volume of core material used in making the saturable reactor may be reduced.

To concentrate the field lines produced by permanent magnet bar 22 of FIGS. 3–5 within the saturating soft ferrite I-core portion 21b, permanent magnet 22 may be magnetized so as to produce the pole arrangement illustrated in FIG. 4 in dashed line. The surface of permanent magnet 22 adjacent the edge formed by faces 16 and 27 is a north pole region; whereas the surface of permanent magnet 22 adjacent the edge formed by faces 17 and 27 is a south pole region.

Advantages of using the geometry of saturable reactor SR of FIGS. 3–5 are simplicity of winding manufacture and assembly, reduction in volume of the saturating core portion thereby reducing losses, and the fewer turns required.

Figure 13:
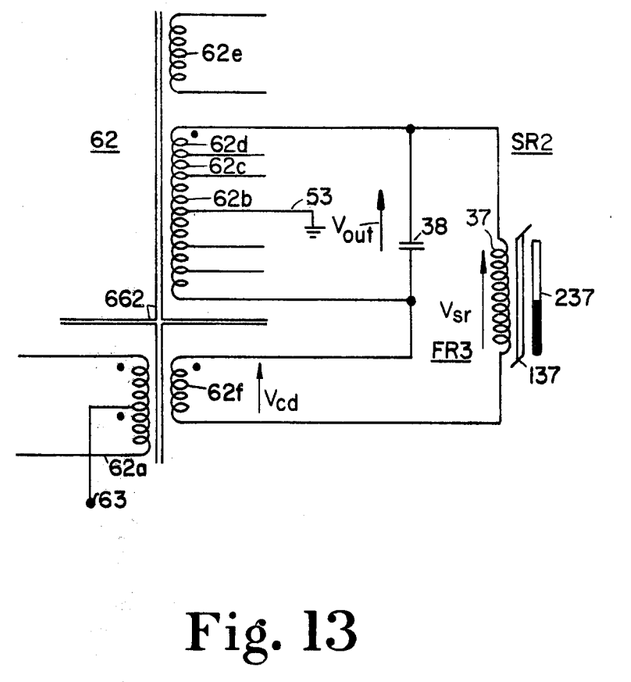
FIG. 13 illustrates a portion of an alternate embodiment of the television receiver ferroresonant power supply of FIG. 2.

FIG. 13 illustrates a portion of the television receiver ferroresonant power supply 80 of FIG. 2 that includes a different embodiment of a ferroresonant load circuit. Elements of FIGS. 2 and 13 commonly identified function in a similar manner. In the ferroresonant load circuit FR3 of FIG. 13, a winding 62f of high leakage inductance transformer 62 is coupled in series with resonating capacitor 38 across coil 37 of the permanent magnet biased saturable reactor SR2. As in FIG. 2, the regulated output voltage Vout is developed across capacitor 38 and is applied directly across secondary output winding 62d, thereby providing regulation of the output voltages developed across all the secondary output windings 62b–62e.

Transformer winding 62f is tightly coupled magnetically with primary winding 62a, but is loosely coupled with secondary output winding 62d. With the winding polarity of winding 62f relative to winding 62d as shown in FIG. 13, the regulated output voltage Vout equals the difference between the voltage $V_{sr}$ developed across coil 37 of saturable reactor SR2 and the voltage $V_{cd}$ developed across transformer winding 62f. Such an arrangement provides improved output voltage regulation, if needed, in a manner similar to that described in the U.S. patent application of D. H. Willis, Ser. No. 255,396, filed Apr. 20, 1981, entitled "TELEVISION RECEIVER FERRORESONANT LOAD POWER SUPPLY WITH REDUCED SATURABLE REACTOR CIRCULATING CURRENT", herein incorporated by reference. Because of the subtractive relationship between the voltage $V_{sr}$ and the voltage $V_{cd}$ when they are algebraically combined to produce the output voltage Vout, an increase in saturable reactor voltage $V_{sr}$, due, for example, to an increase in the unregulated voltage applied to transformer primary winding 62a, is offset by the increase in the voltage $V_{cd}$ developed across transformer winding 62f to maintain the output voltage Vout substantially unchanged in amplitude, half-cycle area, or both.

The arrangement of FIG. 13 incorporating the compensating drive winding 62f in the ferroresonant load circuit FR3 may be useful when the saturable reactor of the ferroesonant load circuit includes permanent magnet biasing to provide temperature stability of the output voltage Vout. When including permanent magnet biasing of the saturable reactor, regulation of the output voltage Vout against unregulated input voltage and loading variations may, however, be somewhat degraded.

Figure 11:
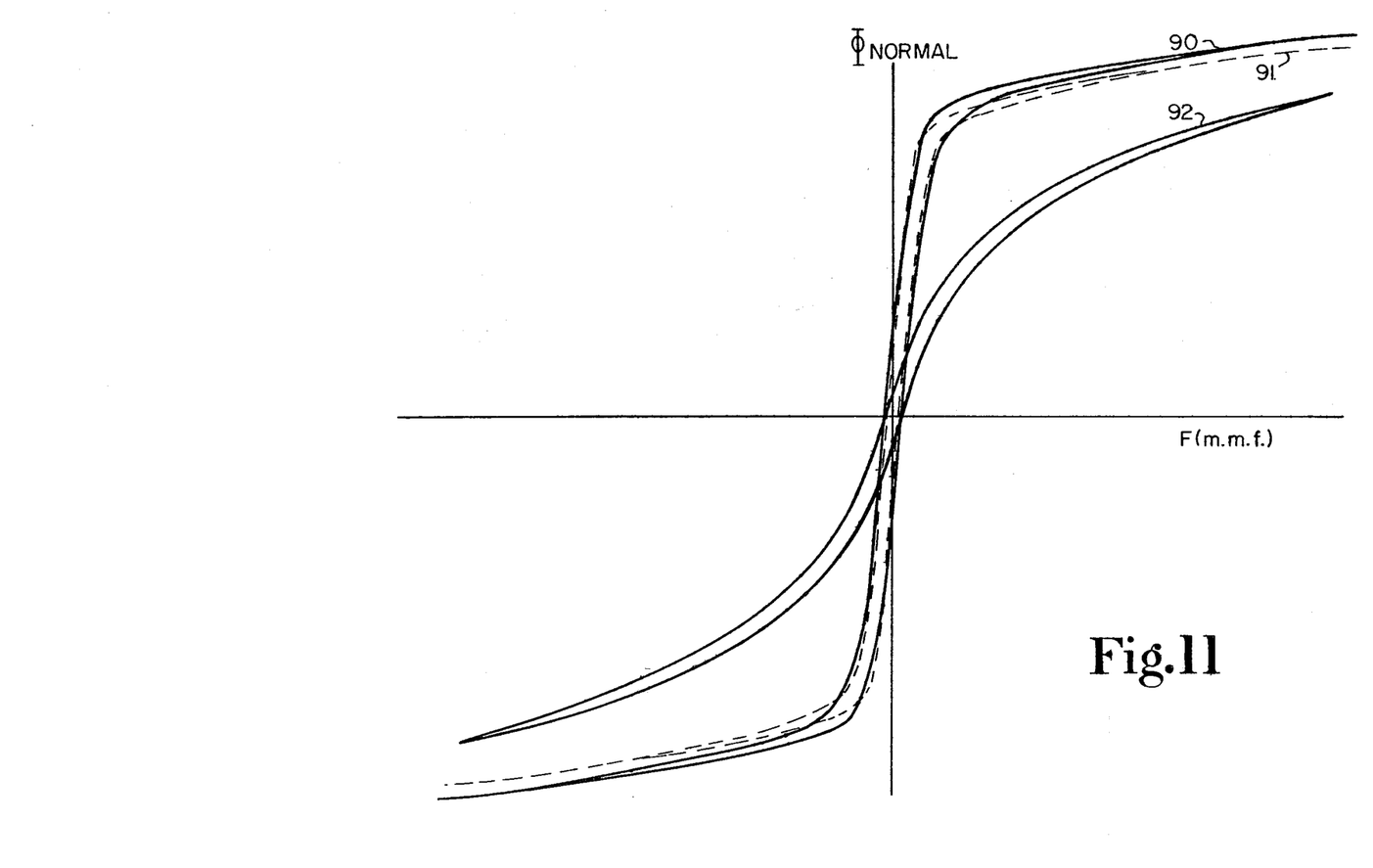

Consider, for example, the magnetic flux—$\Phi$, versus magnetomotive force (m.m.f.)—F characteristic curve illustrated in FIG. 11. Such curves may be associated with operation of a saturable reactor configuration such as that illustrated in FIGS. 3–5 using lithium ferrite as a saturating core magnetizable material. The flux coordinate axis $\Phi$ represents the magnetic flux linking the saturable reactor coil 20, or the magnetic flux, flowing interior to the coil, normal or perpendicular to the conductor turns of the coil.

The $\Phi$-F curves 90 and 91 of FIG. 11 are curves associated with the operation of saturable reactor SR of FIGS. 3–5 when the permanent magnet is removed and no biasing of the core 21 exists. Solid-line curve 90 represents a curve taken at a core operating temperature of, illustratively, 25° C.; whereas dashed-line curve 91 represents a curve taken at a warmer operating temperature of, illustratively, 100°C. As noted from FIG. 11, even when using a relatively temperature stable Bsat material such as lithium ferrite, the flux levels beyond the knee of the curve attained in the saturating core portion of core 21 during the saturated intervals of the output voltage Vout are lower at the warmer core temperatures associated with curve 91 than at the cooler core temperature associated with curve 90.

Curve 92 represents the normal flux versus magnetomotive force for the saturable reactor of FIGS. 3–5 when permanent magnet 22 is inserted over I-core section 21b. Curve 92 represents a curve taken at a core and permanent magnet operating temperature of, illustratively, 25° C. By proper selection of the permanent magnet biasing strength and by proper matching of temperature coefficients $\alpha_f$ and $\alpha_m$ of the saturating core material and the permanent magnet material, a curve taken at a warmer core and magnet operating temperature may be represented by substantially the same curve 92 taken at the cooler operating temperature, indicating that temperature stability of the regulated output voltage has been achieved at the two temperatures.

Comparing curve 92, taken when using permanent magnet biasing, with curves 90 and 91 taken when not using permanent magnet biasing, one notes that the use of permanent magnet biasing reduces the maximum flux level existing in the saturating core at a given maximum magnetomotive force. This reduction in maximum flux level produces a reduction in the amplitude of the regulated output voltage, assuming other factors such as the number of coil turns and cross-section area of the saturating core remain unchanged. One also notes that the permanent magnet biasing produces a shallower slope to the curve 92 during unsaturated operation below the knee of the curve, thereby decreasing somewhat the unsaturated inductance of the saturable reactor coil.

Another effect of using permanent magnet biasing is the production of a more rounded knee and of a relatively steeper slope in the saturated region of curve 92 just immediately beyond the knee. Regulation of the output voltage against input voltage amplitude variations and against loading variations may tend to be degraded. To compensate for any degradation in output voltage regulation produced by the introduction of permanent magnet biasing to the saturable reactor of a ferroresonant arrangement, a ferroresonant circuit such as the ferroresonant circuit FR3 of FIG. 13 may be used, as previously described.

The arrangement of the permanent magnet next to the saturating core is such as to produce an orthogonal baising field in the core portion interior to the saturating coil. A substantially orthogonal biasing field results in a $\Phi$-F curve 92 that is substantially symmetrical with respect to positive and negative values of magnetomotive force, F. The permanent magnet produces a temperature responsive DC bias field in the saturating core which when vectorally added to the AC field produced by the saturable reactor coil results in a net AC field symmetrical about the time axis. Such symmetry is desirable in order to provide good regulation of the output voltage.

Nonuniformity of temperature in the permanent magnet material and in the saturating soft ferrite material and the inability of the permanent magnet to perfectly track the temperature rises of the soft ferrite during power supply warm-up may adversely affect temperature stability of the output voltage. Such effects may be minimized by proper selection of permanent magnet-saturating soft ferrite geometry.

Permanent magnet biasing also reduces hysteresis losses, producing lower saturating core operating temperatures for a given heat sinking configuration.

Another factor affecting output voltage temperature stability is the degree of nonuniformity of bias strength within the volume of saturating core material. To the extent that the bias strength at a particular location approaches the ideal required for a given Bmax at that core location and for given values of $\alpha_f$ and $\alpha_m$, temperature stability is enhanced. The amount of magnet biasing also depends on the crystal orientation of the barium and strontium ferrite relative to the flux lines flowing through the magnet.

In the biased saturable reactor structure of FIGS. 3–5, the magnetizable material of the saturable I-core section 21b may be selected as a lithium ferrite or a substituted lithium ferrite. As C-core section 21a, for the most part, does not saturate, its magnetizable material may be selected as a manganese-zinc ferrite. Permanent magnet 22 may be selected as an oriented barium or strontium ferrite.

We claim:
1. A power supply for a television display system including a regulated ultor power supply with reduced ultor voltage temperature dependence, comprising:
   a source of input voltage;
   means coupled to said source for developing an exciting current;
   a magnetizable core including a saturable core section;

a winding located on said core;

means responsive to said exciting current for generating a magnetic flux in said magnetizable core that links said winding to develop an alternating polarity output voltage;

a capacitance associated with said winding for developing a circulating current that generates a first magnetizing force in said saturable core section;

a permanent magnet for biasing said core so as to produce a second magnetizing force in said saturable core section, the resultant of the two recited magnetizing forces developing a magnetic flux that substantially magnetically saturates said saturable core section for regulating said alternating polarity output voltage;

an ultor terminal; and means responsive to said regulated alternating polarity output voltage for developing an ultor voltage at said ultor terminal.

2. A power supply for a television display system according to claim 1 wherein the tendency of said regulated alternating polarity output voltage to vary with temperature variations in said saturable core section magnetizable material due to the temperature variations of the saturation flux density in said saturable core section magnetizable material is substantially overcome by the accompanying temperature variations of the biasing strength of said permanent magnet.

3. A power supply for a television display system according to claims 1 or 2 wherein the direction of said second magnetizing force is generally transverse to that of said first magnetizing force in a substantial volume of said saturable core section magnetizable material.

4. A power supply for a television display system according to claim 3 wherein said display system includes a deflection winding, a deflection generator responsive to a regulated B+ scanning voltage for generating deflection winding scanning current, and means responsive to said regulated alternating polarity output voltage for generating said regulated B+ scanning voltage.

5. A power supply for a television display system according to claim 3 wherein the negative temperature coefficient of flux density strength of the permanent magnet is greater in magnitude than the negative temperature coefficient of saturation flux density of said saturable core section magnetizable material over the normal operating temperature range of said power supply.

6. A power supply for a television display system according to claim 3 wherein said magnetizable core and said permanent magnet are each formed in the shape of a ring member.

7. A power supply for a television display system according to claim 6 wherein said permanent magnet comprises two ring member sections concentric with each other, each ring member section being magnetized through opposing faces and adjacent faces of the two ring member sections being magnetized to opposite polarities.

8. A power supply for a television display system according to claim 7 wherein said ring member magnetizable core comprises two washers of magnetizable material with said permanent magnet being interposed between the two washers.

9. A power supply for a television display system according to claim 3 wherein said magnetizable core comprises a rectangular core and wherein said permanent magnet comprises a bar in contact with a leg of said rectangular core.

10. A power supply for a television display system according to claim 9 wherein both north and south poles of said permanent magnet are located on the face of said bar that is in contact with said rectangular core leg of said magnetizable core.

11. A power supply for a television display system according to claims 1 or 2 wherein said exciting current developing means comprises a high leakage transformer, a primary winding of said high leakage transformer being coupled to said source of input voltage, a secondary winding of said high leakage transformer being coupled to said winding located on said magnetizable core, said regulated alternating polarity output voltage being developed across said high leakage transformer secondary winding.

12. A power supply for a television display system according to claim 11 wherein said ultor voltage developing means comprises a high voltage winding magnetically coupled to said high leakage transformer secondary winding for stepping up the regulated alternating polarity voltage and a high voltage rectifier arrangement coupled to said high voltage winding for developing said ultor voltage from the voltage developed across and high voltage winding.

13. A ferroresonant regulated power supply having a temperature stable output voltage, comprising:

a source of input voltage;

means coupled to said source for developing an exciting current;

a magnetizable core including a saturable core section;

a winding located on said core;

means responsive to said exciting current for generating a magnetic flux in said magnetizable core that links said winding to develop an alternating polarity output voltage;

a capacitance associated with said winding for developing a circulating current that generates a first magnetizing force in said saturable core section; and a permanent magnet for biasing said core to produce a second magnetizing force in said saturable core section, the resultant of the two recited magnetizing forces developing a magnetic flux that substantially magnetically saturates said saturable core section during each cycle of said alternating polarity output voltage to regulate said alternating polarity output voltage, wherein the tendency of said regulated alternating polarity output voltage to vary with temperature variations in said saturable core section magnetizable material due to temperature variations in the value of saturation flux density of said saturable core section magnetizable material is substantially offset by the accompanying temperature variations of the biasing strength of said permanent magnet.

14. A power supply according to claim 13 wherein the direction of said second magnetizing force is generally transverse to that of said first magnetizing force in a substantial volume of said saturable core section magnetizable material.

15. A power supply according to claim 14 wherein the temperature coefficient of said permanent magnet is two or more times greater in magnitude than the temperature coefficient of said saturable core section magnetizable material over the normal operating temperature range of said power supply.

16. A power supply according to claim 14 wherein said saturable core section magnetizable material is one of a lithium ferrite and a substituted lithium ferrite.

17. A power supply according to claim 16 wherein said permanent magnet is a ceramic magnet.

18. A power supply according to claim 17 wherein said ceramic magnet is one of a barium ferrite and a strontium ferrite.

19. A power supply according to claim 14 wherein said magnetizable core and said permanent magnet are each formed in the shape of a ring member.

20. A power supply according to claim 14 wherein said permanent magnet comprises two ring member sections concentric to each other with each ring member section being magnetized through opposing faces and with adjacent faces of the two ring member sections being magnetized to opposite polarities.

21. A power supply according to claim 20 wherein said magnetizable core comprises two washers of magnetizable material with said permanent magnet being interposed between the two washers.

22. A power supply according to claim 14 wherein said magnetizable core comprises a rectangular core and wherein said permanent magnet comprises a bar in contact with a leg of said rectangular core.

23. A power supply according to claim 22 wherein said permanent magnet is magnetized through a face of said bar that is in contact with said leg of said rectangular core.

24. A power supply according to claim 14 wherein said exciting current developing means comprises a high leakage transformer, a primary winding of said high leakage transformer being coupled to said source of exciting current, a secondary winding of said high leakage transformer being coupled to said winding located on said magnetizable core, said regulated alternating polarity output voltage being developed across said high leakage transformer secondary winding.

25. A television display including the power supply in accordance with claims 13, 14, 15 or 24 wherein said television display includes a high voltage generator responsive to said regulated alternating polarity output voltage for developing a regulated DC ultor voltage.

26. A television display according to claim 25 including a deflection winding, a deflection generator responsive to a regulated B+ scanning voltage for generating deflection winding scanning current, and means responsive to said regulated alternating polarity output voltage for generating said regulated B+ scanning voltage.

27. A saturating core regulated power supply having a temperature stable output voltage, comprising:
a source of input voltage;
means coupled to said source for developing an exciting current;
a magnetizable core including a saturable core section;
a winding located on said core;
means responsive to said exciting current for generating a magnetic flux in said magnetizable core that links said winding to develop an alternating polarity output voltage;
a capacitance associated with said winding for generating in conjunction with said exciting current developing means a first AC, magnetizing force in said saturable core section; and p1 means for biasing said core to produce a second magnetizing force in said saturable core section, the strength of said second magnetizing force varying with variations in the temperature of said saturable core section; the vector sum of the two recited magnetizing forces being an AC magnetizing force substantially symmetrical in time, said vector sum developing a magnetic flux that substantially magnetically saturates said saturable core section during each cycle of said alternating polarity output voltage to produce a circulating current in said capacitance for regulating said alternating polarity output voltage, wherein the tendency of said regulated alternating polarity output voltage to vary with temperature variations in said saturable core section magnetizable material due to temperature variations in the value of the saturation flux density of said saturable core section magnetizable material is substantially offset by the accompanying variations of the strength of said second magnetizing force.

28. A power supply according to claim 27 wherein said biasing means comprises a permanent magnet having a negative temperature coefficient, said permanent magnet producing said second magnetizing force in a direction generally orthogonal to that of said first magnetizing force in a substantial volume of said saturable core section magnetizable material.

29. A power supply according to claim 28 wherein the temperature coefficient of said permanent magnet is two or more times greater in magnitude than the temperature coefficient of said saturable core section magnetizable material over the normal operating temperature range of said power supply.

30. A television display system including the power supply in accordance with claim 28 wherein said television display includes a high voltage generator responsive to said regulated alternating polarity output voltage for developing a regulated, temperature stable DC ultor voltage.

31. A television display system according to claim 30 including a deflection winding, a deflection generator responsive to a regulated B+ scanning voltage for generating deflection winding scanning current, and means responsive to said regulated alternating polarity output voltage for generating said regulated B+ scanning voltage.

* * * * *